United States Patent
Wang

(10) Patent No.: US 7,816,265 B2
(45) Date of Patent: Oct. 19, 2010

(54) METHOD FOR FORMING VIAS IN A SUBSTRATE

(75) Inventor: Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 159 days.

(21) Appl. No.: 12/183,140

(22) Filed: Jul. 31, 2008

(65) Prior Publication Data

US 2009/0035932 A1 Feb. 5, 2009

(30) Foreign Application Priority Data

Aug. 2, 2007 (TW) .............................. 96128415 A

(51) Int. Cl.
*H01L 21/44* (2006.01)

(52) U.S. Cl. ........................ 438/675; 438/672; 438/700; 438/780; 257/E21.007; 257/E21.17; 257/E21.006; 257/E21.058; 257/E21.222; 257/E21.229; 257/E21.237

(58) Field of Classification Search ................. 438/675, 438/637, 700, 672, 680, 673, 674, 687, 706, 438/712, 745, 780; 257/E21.058, 7, 17, 6, 257/222, 237, 229
See application file for complete search history.

(56) References Cited

U.S. PATENT DOCUMENTS

| 5,308,443 | A | 5/1994 | Sugihara |
| 5,998,292 | A | 12/1999 | Black et al. |
| 6,700,175 | B1 * | 3/2004 | Kodama et al. ............. 257/489 |
| 6,809,421 | B1 * | 10/2004 | Hayasaka et al. ........... 257/777 |
| 7,222,420 | B2 | 5/2007 | Moriizumi |
| 7,276,787 | B2 | 10/2007 | Edelstein et al. |
| 2004/0259292 | A1 | 12/2004 | Beyne et al. |
| 2006/0001174 | A1 * | 1/2006 | Matsui ....................... 257/774 |
| 2007/0048896 | A1 * | 3/2007 | Andry et al. ................ 438/106 |

* cited by examiner

*Primary Examiner*—David Nhu
(74) *Attorney, Agent, or Firm*—Volentine & Whitt, P.L.L.C.

(57) ABSTRACT

A method for forming vias in a substrate, including the following steps: (a) providing a substrate having a first surface and a second surface; (b) forming a groove on the substrate; (c) filling the groove with a conductive metal; (d) removing part of the substrate which surrounds the conductive metal, wherein the conductive metal is maintained so as to form an accommodating space between the conductive metal and the substrate; (e) forming an insulating material in the accommodating space; and (f) removing part of the second surface of the substrate to expose the conductive metal and the insulating material. In this way, thicker insulating material can be formed in the accommodating space, and the thickness of the insulating material in the accommodating space is even.

20 Claims, 13 Drawing Sheets

US 7,816,265 B2

1

METHOD FOR FORMING VIAS IN A SUBSTRATE

This application claims priority to Taiwan application 096128415 filed on Aug. 2, 2007.

BACKGROUND OF THE INVENTION

1. Field of the Invention

The present invention relates to a method for forming vias in a substrate, and more particularly to a method for forming an insulating layer on the side wall of vias in a substrate by using polymer.

2. Description of the Related Art

FIGS. 1 to 3 show schematic views of a conventional method for forming vias in a substrate. First, referring to FIG. 1, a substrate 1 is provided. The substrate 1 has a first surface 11 and a second surface 12. Afterward, a plurality of grooves 13 is formed on the first surface 11 of the substrate 1. An insulating layer 14 is then formed on the side wall of the grooves 13 by chemical vapor deposition, and a plurality of accommodating spaces 15 is formed. The material of the insulating layer 14 is usually silicon dioxide.

Afterward, referring to FIG. 2, the accommodating spaces 15 are filled with a conductive metal 16. The material of the conductive metal 16 is usually copper. Finally, the first surface 11 and the second surface 12 of the substrate 1 are ground or etched so as to expose the conductive metal 16, as shown in FIG. 3.

In the conventional method, the insulating layer 14 is formed by chemical vapor deposition, so that the thickness of the insulating layer 14 on the side wall of the grooves 13 is limited, and is usually under 0.5 µm. Moreover, the thickness of the insulating layer 14 on the side wall of the grooves 13 is not even, that is, the thickness of the insulating layer 14 on the upper side wall of the grooves 13 is not exactly equal to that on the lower side wall of the grooves 13. Thus, the electrical capacity is not uniform.

Therefore, it is necessary to provide a method for forming vias in a substrate to solve the above problems.

SUMMARY OF THE INVENTION

The present invention is directed to a method for forming vias in a substrate, which comprises the following steps: (a) providing a substrate having a first surface and a second surface; (b) forming a groove on the substrate; (c) filling the groove with a conductive metal; (d) removing part of the substrate which surrounds the conductive metal, wherein the conductive metal is maintained so as to form an accommodating space between the conductive metal and the substrate; (e) forming an insulating material in the accommodating space; and (f) removing part of the second surface of the substrate to expose the conductive metal and the insulating material.

In the present invention, thicker polymer can be formed in the accommodating space. Also, the thickness of the insulating material in the accommodating space is even. Moreover, the polymer is used as an insulating material in the present invention, so that the polymers with different materials can be chosen for specific processes.

2

FIGS. 4 to 19 are schematic views of a method for forming vias in a substrate according to a first embodiment of the present invention; and FIGS. 20 to 27 are schematic views of a method for forming vias in a substrate according to a second embodiment of the present invention.

DETAILED DESCRIPTION OF THE INVENTION

Figure 1:
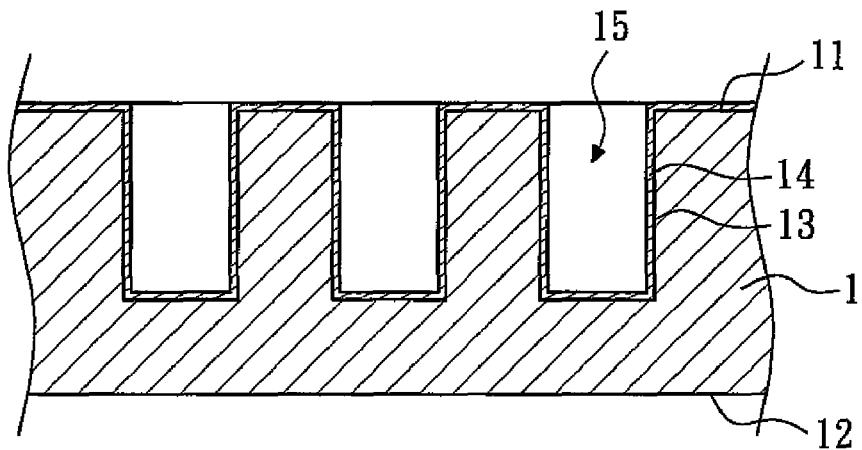
FIGS. 1 to 3 are schematic views of a conventional method for forming vias in a substrate.
Figure 2:
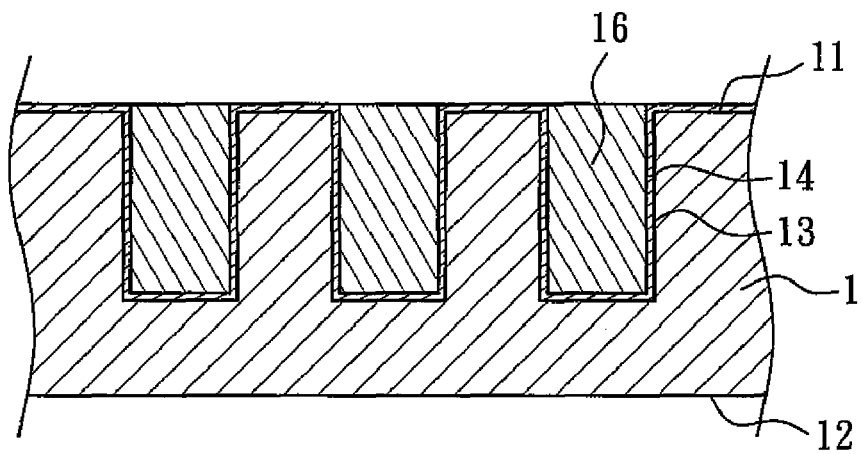
Figure 3:
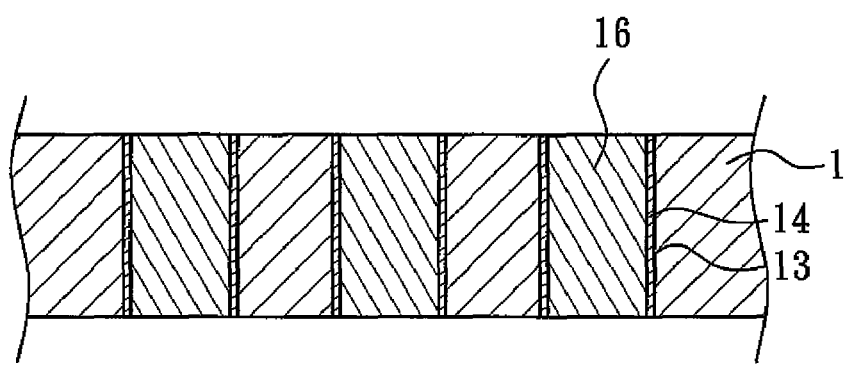
Figure 4:
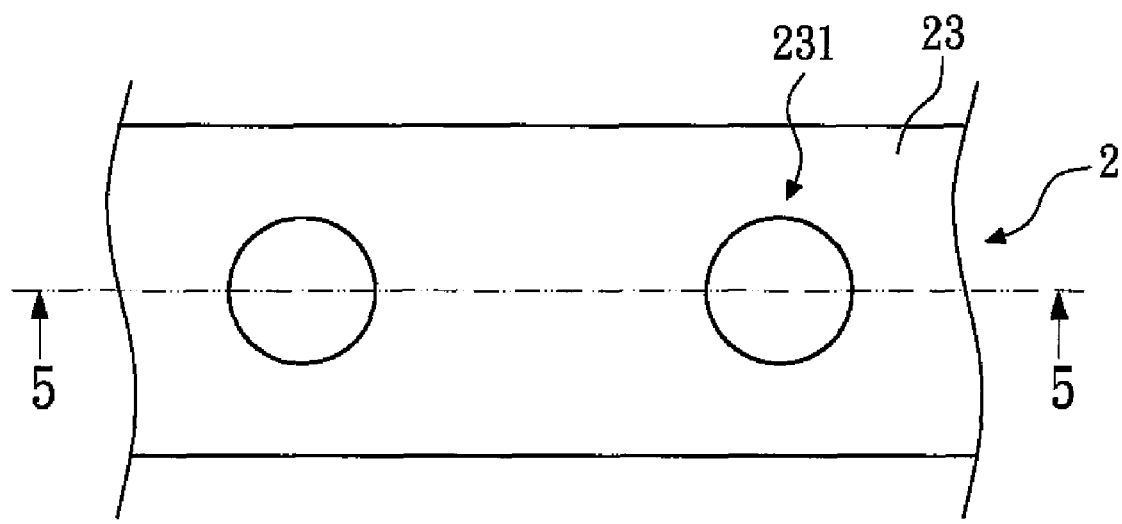
Figure 5:
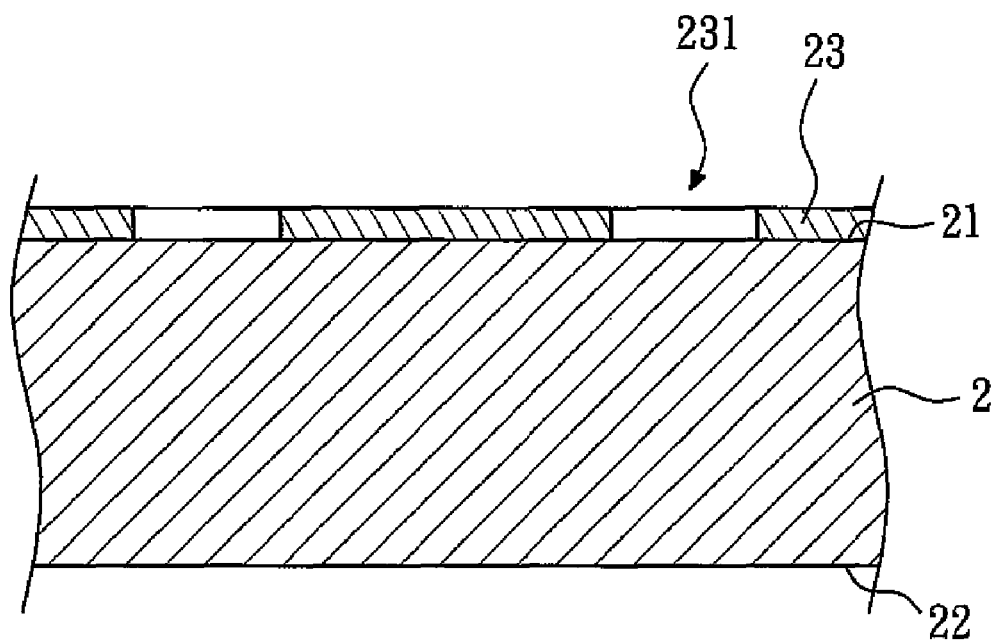

FIGS. 4 to 19 show the schematic views of the method for forming vias in a substrate according to the first embodiment of the present invention. Referring to FIG. 4, a top view of the substrate 2, and FIG. 5, a cross-sectional view of the substrate 2 along line 5-5 in FIG. 4, first, a substrate 2 is provided. The substrate 2 has a first surface 21 and a second surface 22. The substrate 2 is, for example, a wafer or made from silicon. Afterward, a first photo resist layer 23 is formed on the first surface 21 of the substrate 2, and a first opening 231 is formed on the first photo resist layer 23. In the embodiment, the first opening 231 is circular from the top view. It is understood that the first opening 231 may be square from the top view.

Figure 6:
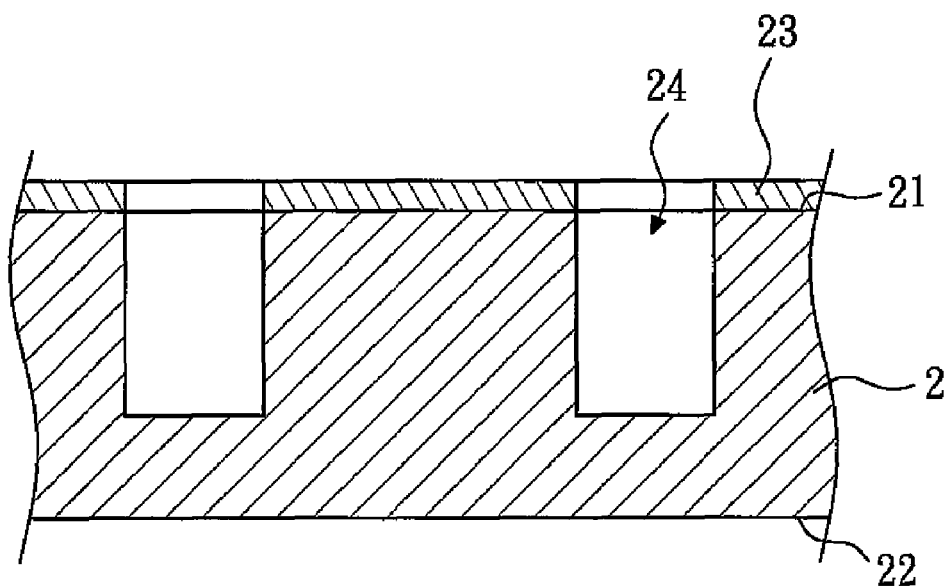
Figure 7:
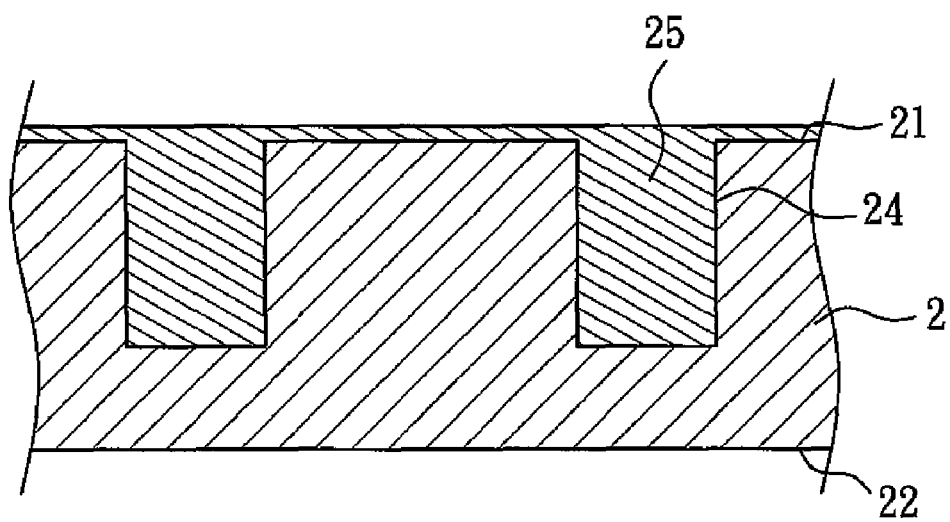
Figure 8:
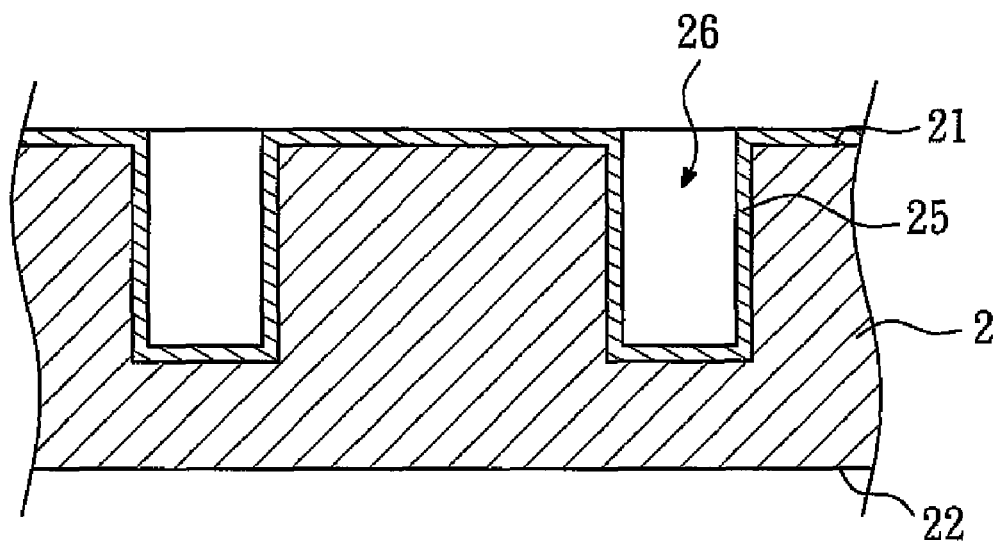

Referring to FIG. 6, a groove 24 is formed on the substrate 2 according to the first opening 231 by etching or other methods, and the groove 24 does not penetrate the substrate 2. Afterward, the first photo resist layer 23 is removed. Then, referring to FIG. 7, the groove 24 is filled with a conductive metal 25. In the embodiment, the material of the conductive metal 25 is copper, and the conductive metal 25 fills up the groove 24 by electroplating. It is understood that the conductive metal 25 may not fill up the groove 24, and forms a central groove 26, that is, the conductive metal 25 is formed on the side wall of the groove 24 only, as shown in FIG. 8.

Figure 9:
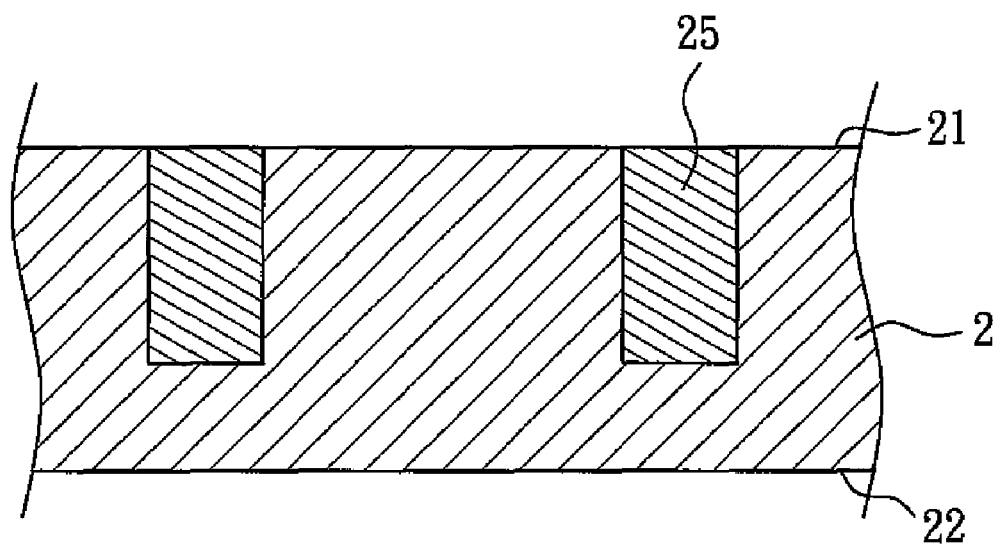
Figure 10:
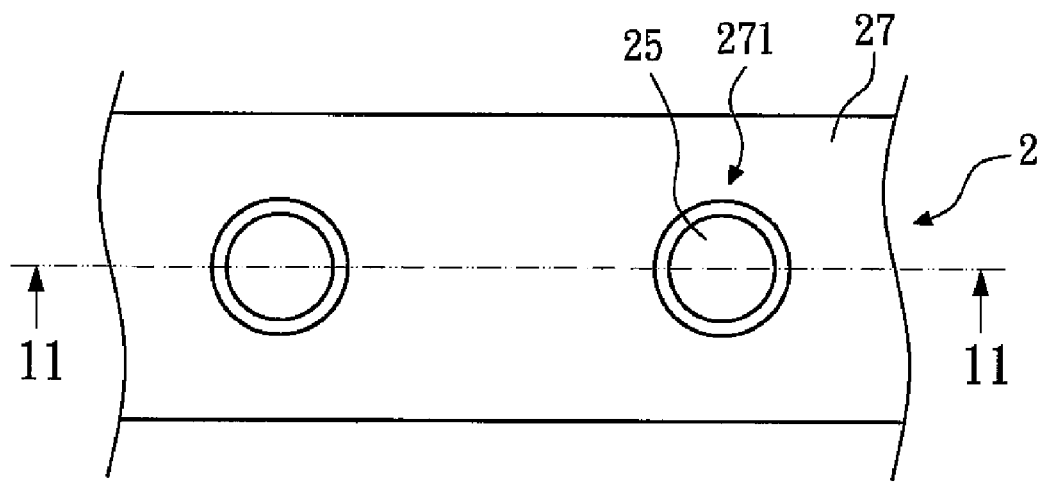
Figure 11:
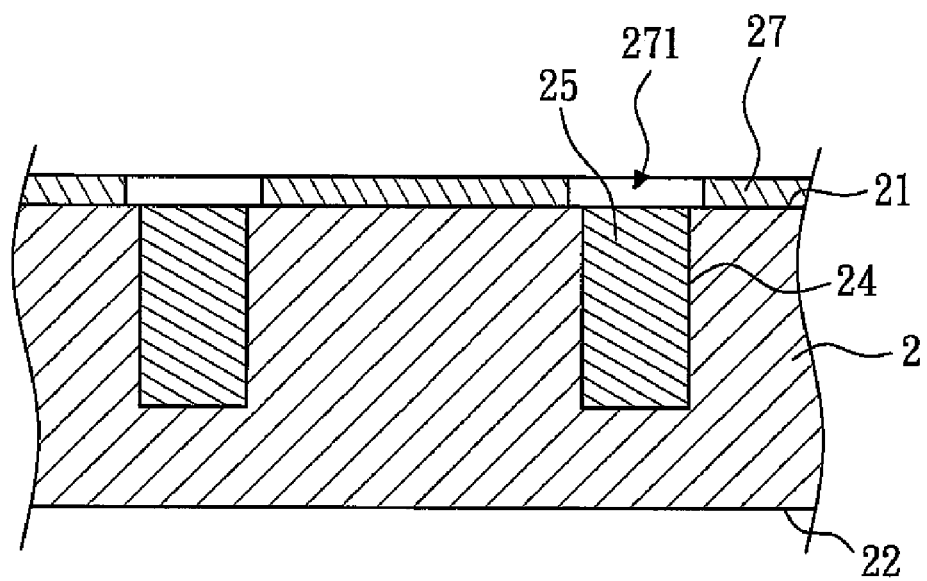
Figure 12:
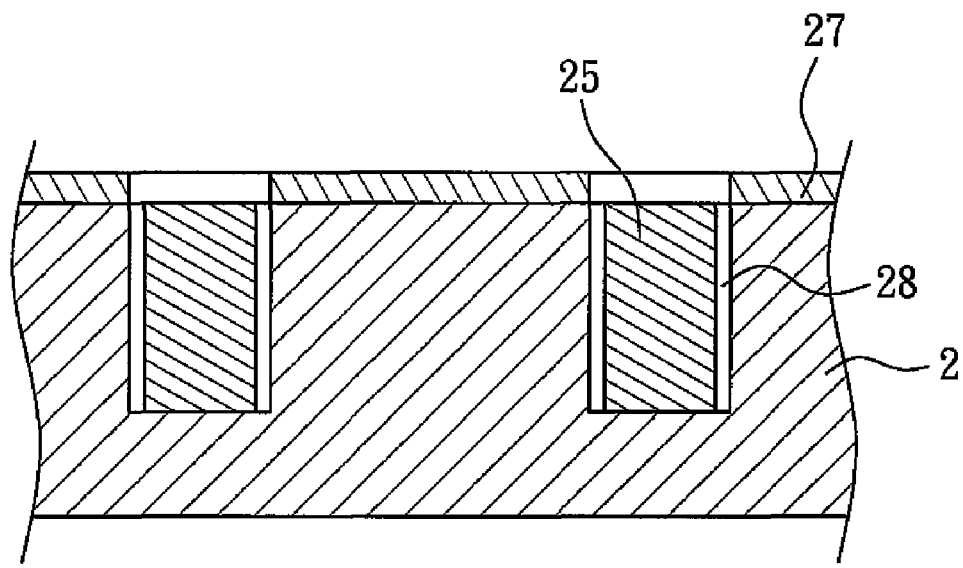

Referring to FIG. 9, the conductive metal 25 which is outside the groove 24 is removed by etching or grinding so as to expose the first surface 21 of the substrate 2. Then, referring to FIGS. 10 to 12, part of the substrate 2 which surrounds the conductive metal 25 is removed, and the conductive metal 25 is maintained so as to form an accommodating space 28 between the conductive metal 25 and the substrate 2. In the embodiment, the accommodating space 28 is formed by the following methods. Referring to FIG. 10, a top view of the substrate 2, and FIG. 11, a cross-sectional view of the substrate 2 along line 11-11 in FIG. 10, first, a second photo resist layer 27 is formed on the first surface 21 of the substrate 2. A second opening 271 is then formed on the second photo resist layer 27, and is at a position corresponding to the groove 24. The second opening 271 is larger than the first opening 231 (FIGS. 4 and 5) so as to expose the conductive metal 25. In the embodiment, the second opening 271 is circular and has a central axis, the groove 24 is circular and has a central axis, and the central axes of the second opening 271 and the groove 24 are the same, that is, the central axis of the second opening 271 is the central axis of the groove 24. It is understood that the central axes of the second opening 271 and the groove 24 may not be the same, but the conductive metal 25 must be exposed. Then, referring to FIG. 12, part of the substrate 2 which surrounds the conductive metal 25 is removed by etching or other methods, and the conductive metal 25 is maintained so as to form an accommodating space 28 between the conductive metal 25 and the substrate 2. The accommodating space 28 surrounds the conductive metal 25. The second photo resist layer 27 is then removed.

Referring to FIGS. 13 to 18, an insulating material is formed in the accommodating space 28. In the embodiment, the insulating material is polymer 29. However, the insulating material may be silicon dioxide or other material with a property of insulation. In the present invention, the method for forming the polymer 29 in the accommodating space 28 includes but is not limited to the following three methods.

Figure 13:
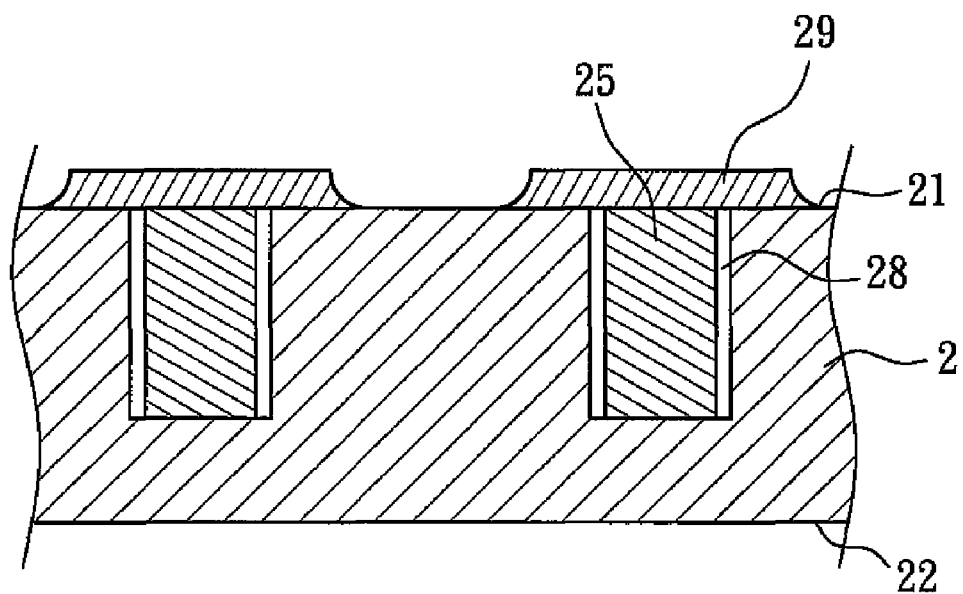
Figure 14:
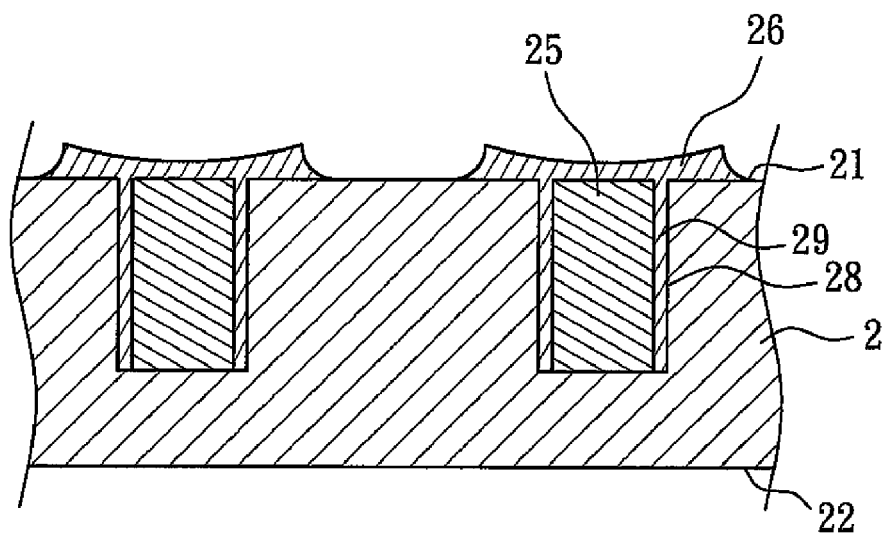
Figure 18:
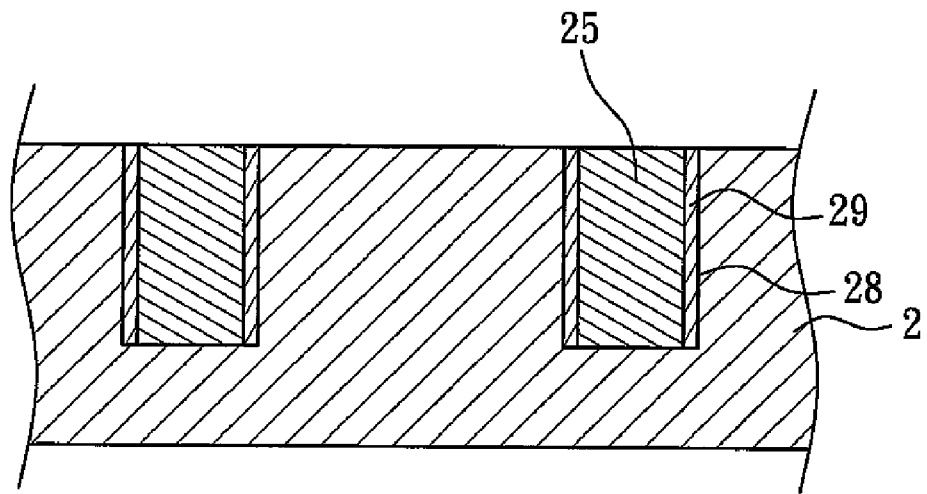

The first method is that the polymer 29 is dispersed on the first surface 21 of the substrate 2, and the position of the polymer 29 corresponds to the accommodating space 28, as shown in FIG. 13. Afterward, the polymer 29 is sucked into the accommodating space 28 by vacuuming, as shown in FIG. 14. Finally, part of the polymer 29 which is outside the accommodating space 28 is removed, as shown in FIG. 18.

Figure 15:
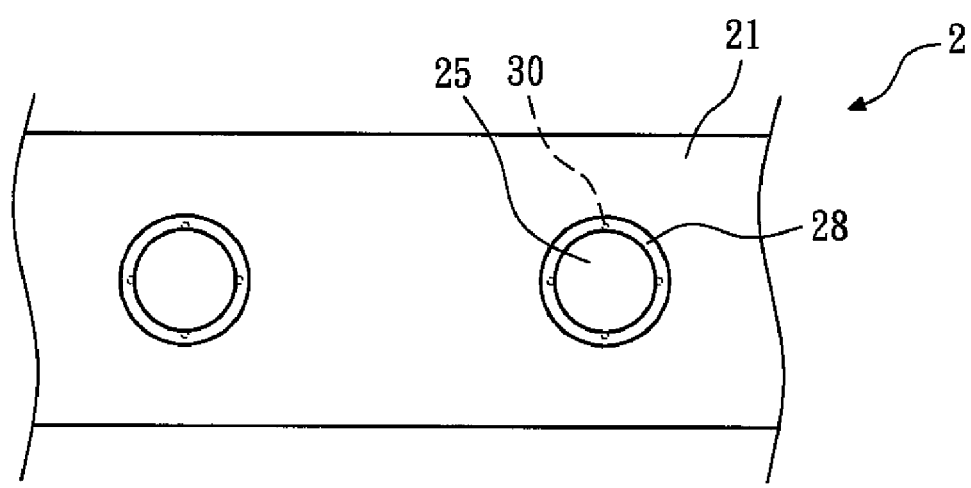
Figure 16:
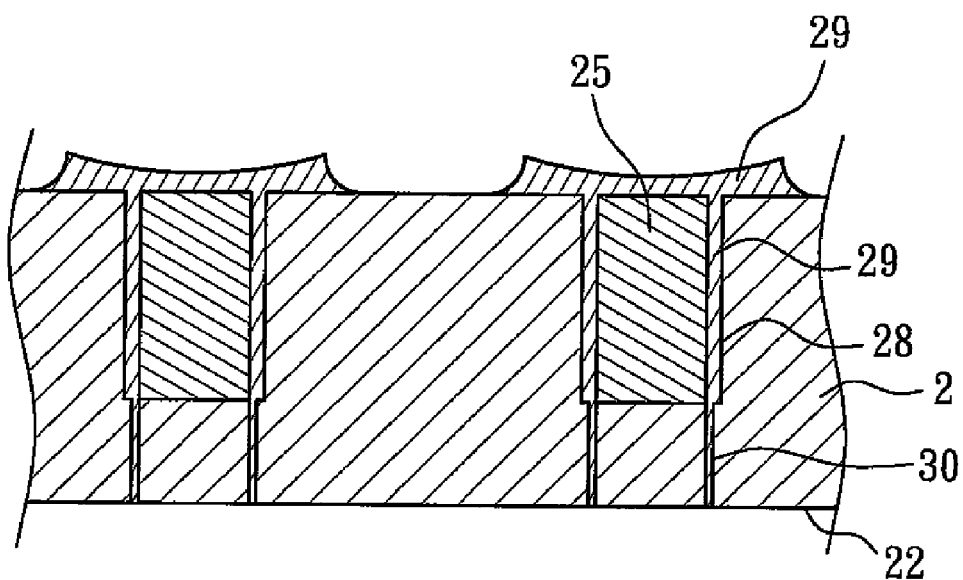

The second method is that a plurality of vents 30 is formed to connect the accommodating space 28 to the second surface 22 of the substrate 2, as shown in the top view of FIG. 15. Afterward, the polymer 29 is dispersed on the first surface 21 of the substrate 2, and the position of the polymer 29 corresponds to the accommodating space 28. The accommodating space 28 and the vents 30 are then filled with the polymer 29, as shown in FIG. 16. Finally, part of the polymer 29 which is outside the accommodating space 28 and the vents 30 is removed.

Figure 17:
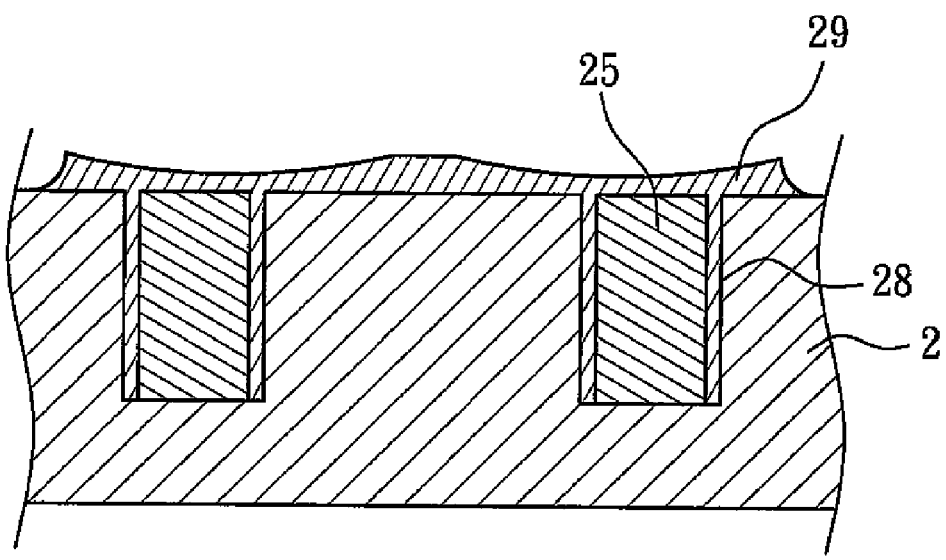

The third method is that the polymer 29 is atomized and deposited in the accommodating space 28 by spray coating, as shown in FIG. 17. Finally, part of the polymer 29 which is outside the accommodating space 28 is removed, as shown in FIG. 18.

It should be noted that in the previous steps, if the conductive metal 25 does not fill up the groove 24, it forms a central groove 26 instead, as shown in FIG. 8. In the above-mentioned three methods, the polymer 29 fills up both the accommodating space 28 and the central groove 26.

Figure 19:
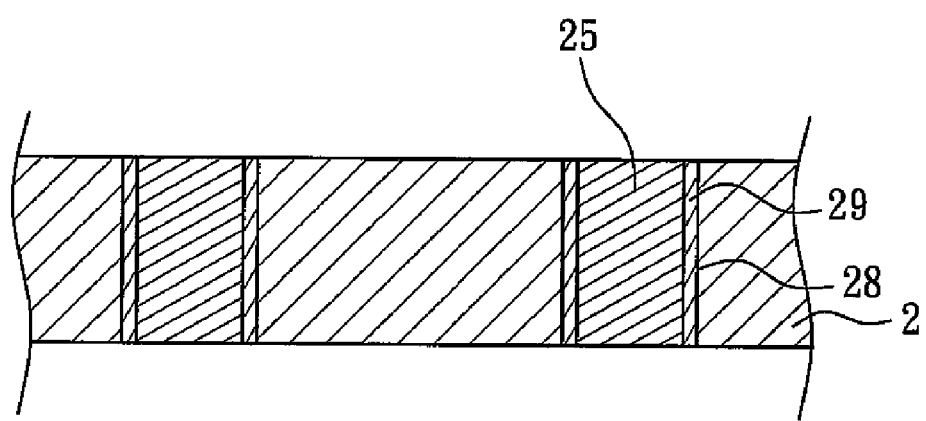

Finally, referring to FIG. 19, part of the second surface 22 of the substrate 2 is removed by etching or grinding so as to expose the conductive metal 25 and the insulating material (the polymer 29). Part of the first surface 21 of the substrate 2 may preferably be removed by etching or grinding at the same time.

Figure 20:
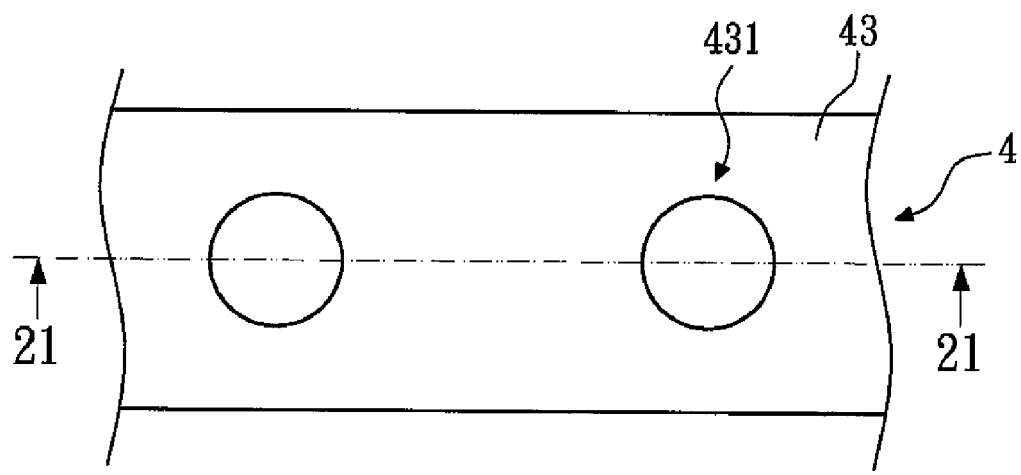

FIGS. 20 to 27 show the schematic views of the method for forming vias in a substrate according to the second embodiment of the present invention. Referring to FIG. 20, a top view of the substrate 4, and FIG. 21, a cross-sectional view of the substrate 4 along line 21-21 in FIG. 20, first, a substrate 4 is provided. The substrate 4 has a first surface 41 and a second surface 42. The substrate 4 is, for example, a wafer or made from silicon. Afterward, a first photo resist layer 43 is formed on the first surface 41 of the substrate 4, and a first opening 431 is formed on the first photo resist layer 43.

Figure 22:
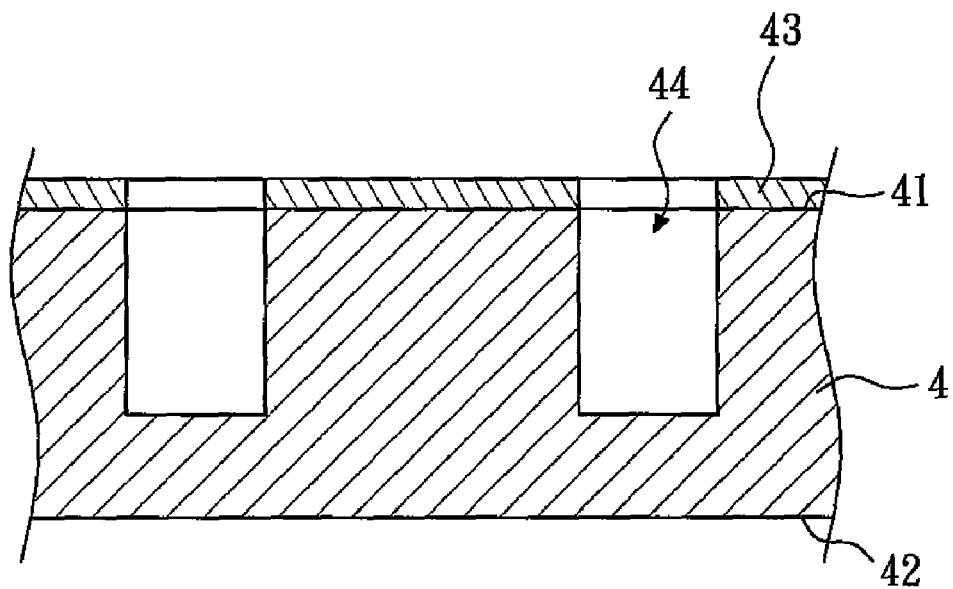
Figure 23:
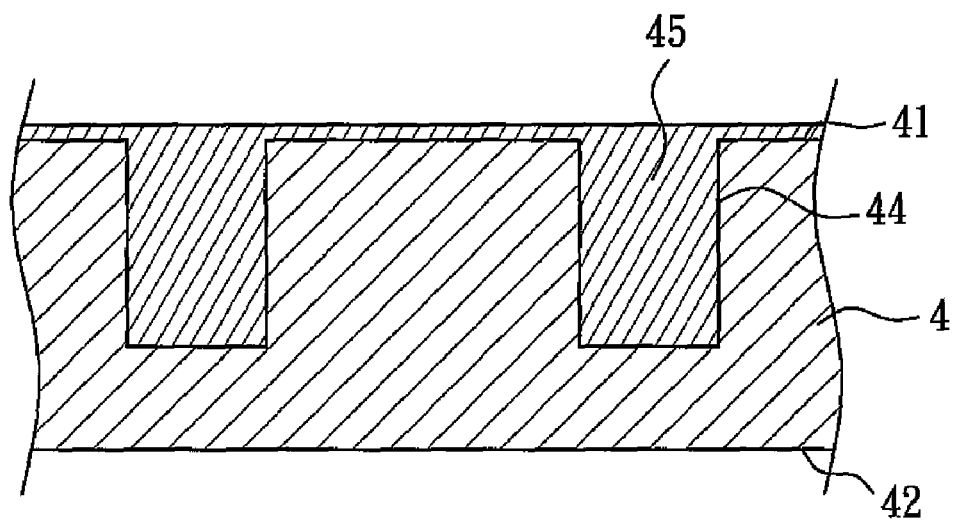

Referring to FIG. 22, a groove 44 is formed on the substrate 4 according to the first opening 431 by etching or other methods, and the groove 44 does not penetrate the substrate 4. Afterward, the first photo resist layer 43 is removed. Then, referring to FIG. 23, the groove 44 is filled with a conductive metal 45. In the embodiment, the material of the conductive metal 45 is copper, and the conductive metal 45 fills up the groove 44 by electroplating. It is understood that the conductive metal 45 may not fill up the groove 44.

Figure 21:
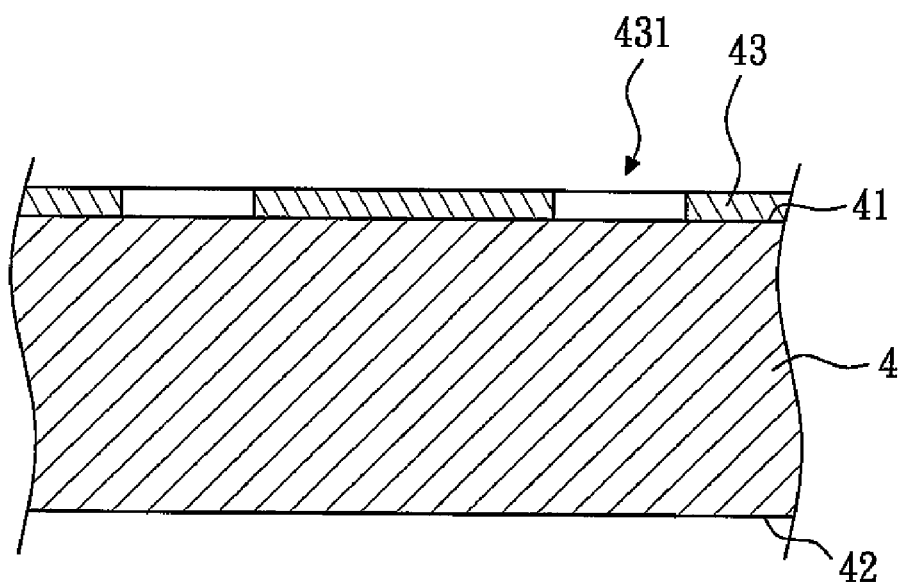
Figure 24:
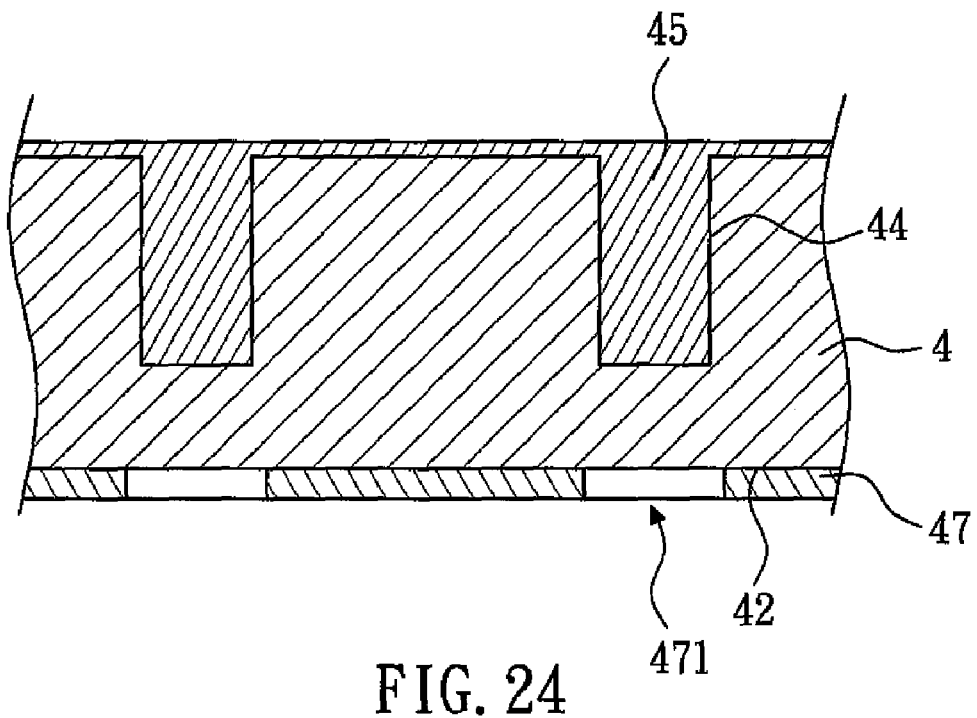
Figure 25:
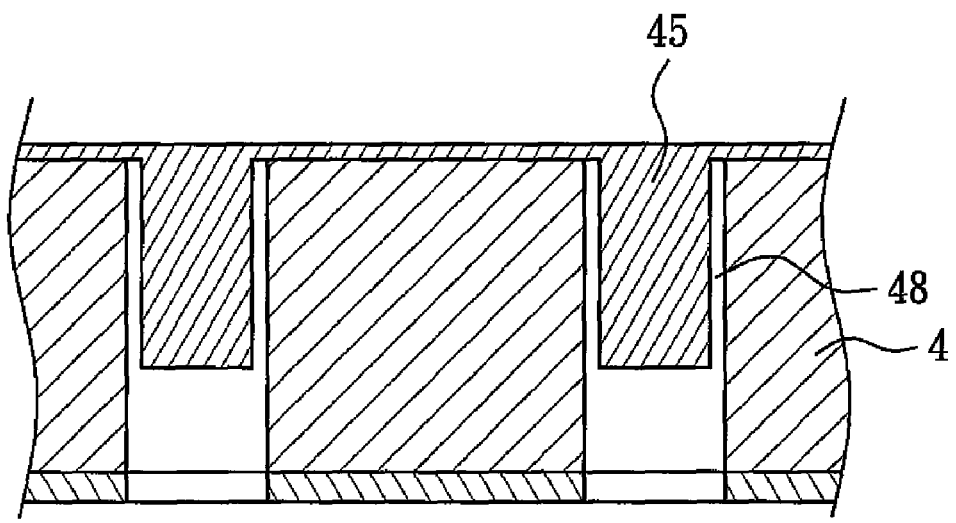

Referring to FIGS. 24 to 25, part of the substrate 4 which surrounds the conductive metal 45 is removed, and the conductive metal 45 is maintained to form an accommodating space 48 between the conductive metal 45 and the substrate 4. In the embodiment, the accommodating space 48 is formed by the following methods. First, referring to FIG. 24, a second photo resist layer 47 is formed on the second surface 42 of the substrate 4. A second opening 471 is then formed on the second photo resist layer 47, and is at a position corresponding to the groove 44. The second opening 471 is larger than the first opening 431 (FIG. 21). In the embodiment, the second opening 471 is circular and has a central axis, the groove 44 is circular and has a central axis, and the central axes of the second opening 471 and the groove 44 are the same, that is, the central axis of the second opening 471 is the central axis of the groove 44. It is understood that the central axes of the second opening 471 and the groove 44 may not be the same. Then, referring to FIG. 25, part of the substrate 4 which surrounds the conductive metal 45 is removed by etching or other methods, and the conductive metal 45 is maintained so as to form an accommodating space 48 between the conductive metal 45 and the substrate 4. The accommodating space 48 surrounds the conductive metal 45. The second photo resist layer 47 is then removed.

Figure 26:
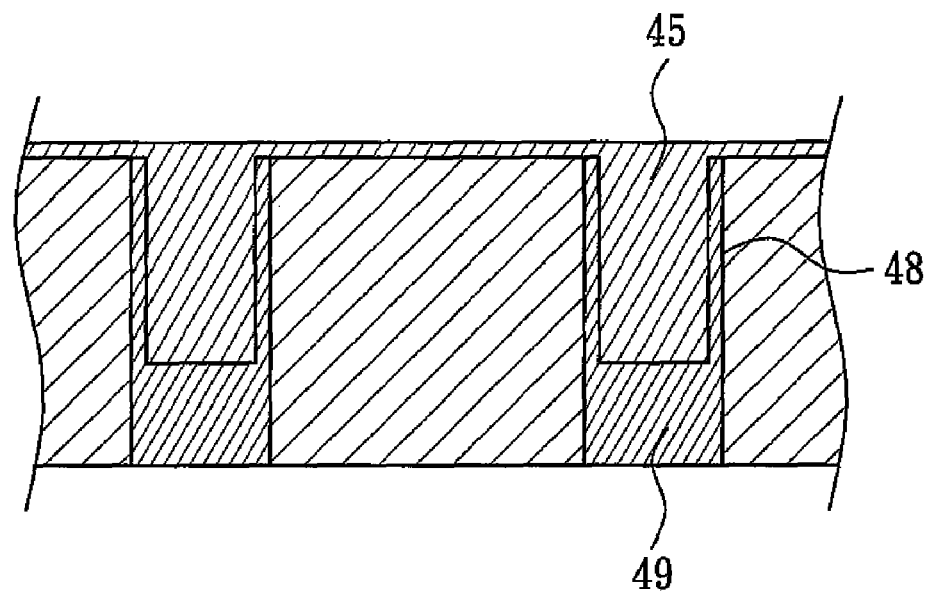

Referring to FIG. 26, an insulating material is formed in the accommodating space 48. In the embodiment, the material of the insulating material is polymer 49. However, the material of the insulating material may be silicon dioxide or other material with a property of insulation. In the present invention, the method for forming the polymer 49 in the accommodating space 48 includes but is not limited to the three methods described above in the first embodiment.

Figure 27:
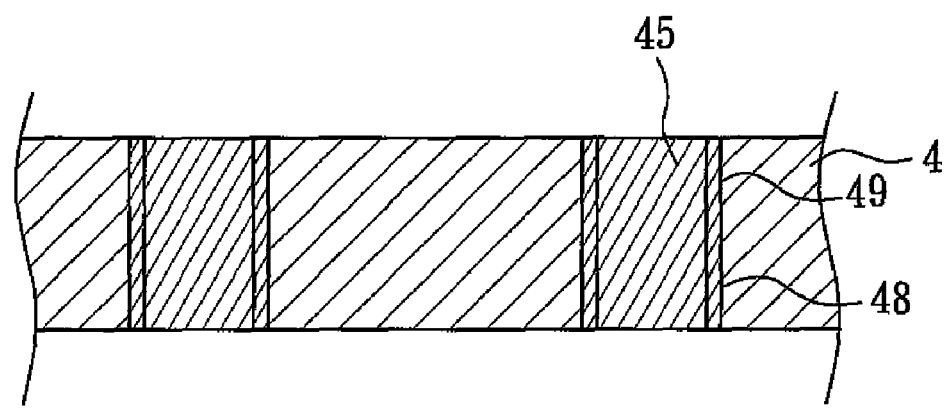

Finally, referring to FIG. 27, part of the second surface 42 of the substrate 4 is removed by etching or grinding to expose the conductive metal 45 and the insulating material (the polymer 49). Part of the first surface 41 of the substrate 4 may preferably be removed by etching or grinding at the same time.

In the present invention, thicker insulating material (polymer 29, 49 for example) can be formed in the accommodating space 28, 48. Also, the thickness of the insulating material (polymer 29, 49 for example) in the accommodating space 28, 48 is even. Moreover, the polymer 29, 49 is used as an insulating material in the present invention, so that the polymers with different materials can be chosen for specific processes.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming vias in a substrate, comprising:
   (a) providing a substrate having a first surface and a second surface;
   (b) forming a groove on the substrate;
   (c) filling the groove with a conductive metal;
   (d) forming a second photo resist layer on the first surface of the substrate;
   (e) forming a second opening on the second photo resist layer, wherein a position of the second opening corresponds to the groove;
   (f) removing part of the substrate which surrounds the conductive metal, wherein the conductive metal is maintained so as to form an accommodating space between the conductive metal and the substrate;
   (g) forming an insulating material in the accommodating space; and
   (h) removing part of the second surface of the substrate to expose the conductive metal and the insulating material.

2. The method for forming vias in a substrate according to claim 1, wherein Step (b) further comprising:
   (b1) forming a first photo resist layer on the first surface of the substrate;
   (b2) forming a first opening on the first photo resist layer; and
   (b3) forming the groove on the substrate according to the first opening.

3. The method for forming vias in a substrate according to claim 1, wherein the conductive metal does not fill up the groove so as to form a central groove, and the insulating material fills up the accommodating space and the central groove.

4. The method for forming vias in a substrate according to claim 1, wherein in Step (f), part of the substrate which surrounds the conductive metal is removed by etching, and the conductive metal is not etched.

5. A method for forming vias in a substrate, comprising:
   (a) providing a substrate having a first surface and a second surface;
   (b) forming a groove on the substrate;
   (c) filling the groove with a conductive metal;
   (d) forming a second photo resist layer on the second surface of the substrate;
   (e) forming a second opening on the second photo resist layer, wherein a position of the second opening corresponds to the groove;
   (f) removing part of the substrate which surrounds the conductive metal, wherein the conductive metal is maintained so as to form a accommodating space between the conductive metal and the substrate;
   (g) forming an insulating material in the accommodating space; and
   (h) removing part of the second surface of the substrate to expose the conductive metal and the insulating material.

6. The method for forming vias in a substrate according to claim 5, wherein Step (b) further comprising:
   (b1) forming a first photo resist layer on the first groove on the substrate;
   (b2) forming a first opening on the first photo resist layer; and
   (b3) forming the groove on the substrate according to the first opening.

7. The method for forming vias in a substrate according to claim 5, wherein the conductive metal does not fill up the groove so as to form a central groove, and the insulating material fills up the accommodating space and the central groove.

8. The method for forming vias in a substrate, according to claim 5, wherein in Step (f), part of the substrate which surrounds the conductive metal is removed by etching, and the conductive metal is not etched.

9. A method for forming vias in a substrate, comprising:
   (a) providing a substrate having a first surface and a second surface;
   (b) forming a groove on the substrate;
   (c) filling the groove with a conductive metal;
   (d) removing part of the substrate which surrounds the conductive metal, wherein the conductive metal is maintained so as to form an accommodating space between the conductive metal and the substrate;
   (e) dispersing an insulating material at a position corresponding to the accommodating space, wherein the insulating material is polymer;
   (f) sucking the polymer into the accommodating space by vacuuming; and
   (g) removing part of the second surface of the substrate to expose the conductive metal and the insulating material.

10. The method for forming vias in a substrate according to claim 9, wherein Step (b) further comprising:
    (b1) forming a first photo resist layer on the first surface of the substrate;
    (b2) forming a first opening on the first photo resist layer; and
    (b3) forming the groove on the substrate according to the first opening.

11. The method for forming vias in a substrate according to claim 9, wherein the conductive metal does not fill up the groove so as to form a central groove, and the insulating material fills up the accommodating space and the central groove.

12. The method for forming vias in a substrate according to claim 9, wherein in Step (d), part of the substrate which surrounds the conducive metal is removed by etching, and the conductive metal is not etched.

13. A method for forming vias in a substrate, comprising:
    (a) providing a substrate having a first surface and a second surface;
    (b) forming a groove on the substrate;
    (c) filling the groove with a conductive metal;
    (d) removing part of the substrate which surrounds the conductive metal, wherein the conductive metal is maintained so as to form an accommodating space between the conductive metal and the substrate;
    (e) forming a plurality of vents to connect the accommodating space to the second surface of the substrate;
    (f) dispersing an insulating material at a position corresponding to the accommodating space, wherein the insulating material is polymer;
    (g) filling the accommodating space and the vents with polymer; and
    (h) removing part of the second surface of the substrate to expose the conductive metal and the insulating material.

14. The method for forming vias in a substrate according to claim 13, wherein Step (b) further comprising:
    (b1) forming a first photo resist layer on the first surface of the substrate;
    (b2) forming a first opening on the first photo resist layer; and
    (b3) forming the groove on the substrate according to the first opening.

15. The method for forming vias in a substrate according to claim 13, wherein the conductive metal does not fill up the groove so as to form a central groove, and the insulating material fills up the accommodating space and the central groove.

16. The method for forming vias in a substrate according to claim 13, wherein in step (d), part of the substrate which surrounds the conductive metal is removed by etching, and the conductive metal is not etched.

17. A method for forming vias in a substrate, comprising:
    (a) providing a substrate having a first surface and a second surface;
    (b) forming a groove on the substrate;
    (c) filling the groove with a conductive metal;
    (d) removing part of the substrate which surrounds the conductive metal, wherein the conductive metal is maintained so as to form an accommodating space between the conductive metal and the substrate;
    (e) forming an insulating material in the accommodating space, wherein the insulating material is polymer, and the polymer is atomized and deposited in the accommodating space by spray coating; and (f) removing part of the second surface of the substrate to expose the conductive metal and the insulating material.

18. The method for forming vias in a substrate according to claim 17, wherein Step (b) further comprising:
   (b1) forming a first photo resist layer on the first surface of the substrate;
   (b2) forming a first opening on the first photo resist layer; and
   (b3) forming the groove on the substrate according to the first opening.

19. The method for forming vias in a substrate according to claim 17, wherein the conductive metal does not fill up the groove so as to form a central groove, and the insulating material fills up the accommodating space and the central groove.

20. The method for forming vias in a substrate according to claim 17, wherein in step (d), part of the substrate which surrounds the conductive metal is removed by etching, and the conductive metal is not etched.

* * * * *